(12) United States Patent
Lu et al.

(10) Patent No.: US 6,677,251 B1
(45) Date of Patent: *Jan. 13, 2004

(54) METHOD FOR FORMING A HYDROPHILIC SURFACE ON LOW-K DIELECTRIC INSULATING LAYERS FOR IMPROVED ADHESION

(75) Inventors: Hsin-Hsien Lu, Hsinchu (TW); Aaron Song, Hsinchu (TW); Tien-I Bao, Hsin-Chu (TW); Syun-Ming Jang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/207,339

(22) Filed: Jul. 29, 2002

(51) Int. Cl.$^7$ .................. H01L 21/31; H01L 21/469; H01L 21/26
(52) U.S. Cl. .................. 438/778; 438/618; 438/622; 438/623; 438/624; 438/627; 438/634; 438/637; 438/643
(58) Field of Search ................ 438/778, 637, 438/624, 627, 634, 643, 618, 622, 623

(56) References Cited

U.S. PATENT DOCUMENTS 6,346,488 B1 * 2/2002 Kabansky .................. 438/783
6,350,679 B1 * 2/2002 McDaniel et al. .......... 438/634
6,455,417 B1 * 9/2002 Bao et al. ................... 438/637

* cited by examiner

Primary Examiner—Hoai Ho
Assistant Examiner—Renee R Berry
(74) Attorney, Agent, or Firm—Tung & Associates

(57) ABSTRACT

A method for forming a dielectric insulating layer with increased hydrophilicity for improving adhesion of an adjacently deposited material layer in semiconductor device manufacturing including providing a semiconductor wafer having a process surface for forming a dielectric insulting layer thereover; depositing the dielectric insulating layer; and, subjecting the dielectric insulating layer including an exposed surface to a hydrophilicity increasing treatment including at least one of a dry plasma treatment and a wet process including contacting the exposed surface with a hydrophilicity increasing solution including a surfactant said wet process followed by a baking process to improve an adhesion of an adjacently deposited material layer.

20 Claims, 2 Drawing Sheets

METHOD FOR FORMING A HYDROPHILIC SURFACE ON LOW-K DIELECTRIC INSULATING LAYERS FOR IMPROVED ADHESION

FIELD OF THE INVENTION

This invention generally relates to semiconductor device manufacturing methods and more particularly to a method for reforming a hydrophobic low-k dielectric insulating layer surface to a hydrophilic surface for improved adhesion to adjacently formed material layers.

BACKGROUND OF THE INVENTION

In semiconductor fabrication, various layers of insulating material, semiconducting material and conducting material are formed to produce a multi-level semiconductor device. One of the limiting factors in the continuing evolution toward smaller device size and higher density has been signal delay caused by parasitic effects of insulating materials in which metal interconnects are formed to interconnect devices. It has become necessary to reduce capacitance of the insulating layers to allow the insulating layer thicknesses to shrink along with other device features such as metal interconnect line width. As a result, the need for lower dielectric constant materials has resulted in the development of several different types of organic and inorganic low-k materials.

During the formation of semiconductor devices it is often required that the conductive layers be interconnected through holes in an insulating layer. Such holes are commonly referred to as contact holes when the hole extends through an insulating layer to an active device area, or vias, when the hole extends through an insulating layer between two conductive layers.

Manufacturing processes such as, for example, damascene processes, have been implemented to form metallization vias and interconnect lines (trench lines) by dispensing entirely with the metal etching process. The damascene process is a well known semiconductor fabrication method for forming multiple layers of metallization vias and interconnect lines. For example, in the dual damascene process, a trench opening and via opening is etched in one or more dielectric insulating layers also known as an inter-metal dielectric (IMD) layers or inter-level dielectric (ILD) layers. The insulating layers are typically formed over a substrate including another conductive area over which the vias and trench lines are formed to provide electrical communication. After a series of photolithographic steps defining via openings and trench openings, via and the trench openings are filled with a metal, preferably copper, to form vias and trench lines, respectively. The excess metal above the trench line level is then removed by well known chemical-mechanical planarization (polishing) (CMP) processes.

As indicated, advances in semiconductor device processing technology demands the increasing use of low-k (low dielectric constant) insulating materials in, for example, inter-metal dielectric (IMD) layers that make up the bulk of a multi-level device. In order to reduce signal delays caused by parasitic effects related to the capacitance of insulating layers, for example, IMD layers, incorporation of low-k materials with dielectric constants less than about 3.5 has become standard practice as semiconductor feature sizes have diminished to 0.13 microns and below. Many of the low-k materials are designed with a high degree of porosity to allow the achievement of lower dielectric constants.

Several silicon oxide based materials have been developed including fluorine doped and hydrocarbon doped silicon oxides also often referred to as organo silicate glass (OSG) formed in layers, for example IMD layers, by CVD or spin-on processes where the dielectric constant may be varied over a range of values depending on the precursors and process conditions. Low-k doped silicon oxides for example, may be formed with dielectric constants over a range of about 1.8 to about 3.2 and having densities of about 1.3 g/cm$^3$ to about 1.8 g/cm$^3$ compared to dielectric constants of about 4.1 and a density of about 2.3 g/cm$^3$ for silicon dioxides (e.g., un-doped TEOS).

Among the problems presented by doped silicon oxide low-k materials including IMD layers are low strength and a proclivity to cracking or peeling in subsequent stress-inducing manufacturing processes including, for example, chemical mechanical planarization (CMP). The problem of peeling is related to the poor adhesion demonstrated by typical low-k IMD layers to deposited overlying layers, thereby peeling when stresses oriented parallel to the layer interfaces are applied, for example in CMP processes. Several approaches in the prior art to solve the peeling problem have included adding one or more capping layers over the low-k dielectric insulating layers including, for example, silicon dioxide (e.g., CVD TEOS), or spin-on glasses (SOG). While capping layers have had some success, the addition of the capping layers contributes undesirably to the overall capacitance of the multi-level device. In addition, the capping layers have themselves often demonstrate poor adhesion to overlying layers.

It would therefore be advantageous to develop a method for forming a low-k dielectric insulating layer with improved layer interface adhesion while reducing contributions to overall capacitance in a multi-layer semiconductor device.

It is therefore an object of the invention to provide a method for forming a low-k dielectric insulating layer with improved layer-interface adhesion while reducing contributions to overall capacitance in a multi-layer semiconductor device while overcoming other deficiencies and shortcomings of the prior art.

SUMMARY OF THE INVENTION

To achieve the foregoing and other objects, and in accordance with the purposes of the present invention, as embodied and broadly described herein, the present invention provides a method for forming a dielectric insulating layer with increased hydrophilicity for improving adhesion of an adjacently deposited material layer in semiconductor device manufacturing.

In a first embodiment, the method includes providing a semiconductor wafer having a process surface for forming a dielectric insulting layer thereover; depositing the dielectric insulating layer; and, subjecting the dielectric insulating layer including an exposed surface to a hydrophilicity increasing treatment including at least one of a dry plasma treatment and a wet process including contacting the exposed surface with a hydrophilicity increasing solution including a surfactant
        said wet process followed by a baking process to improve an adhesion of an adjacently deposited material layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1:
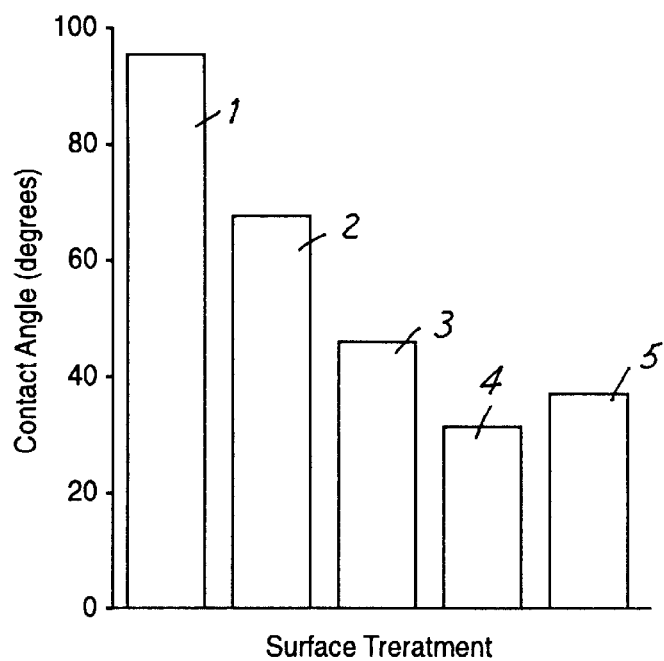
FIG. 1 is a Bar graph representing contact angle measurements of an exemplary doped silicon oxide IMD layer following surface treatments according to embodiments of the present invention and contrasted with the 'as deposited' condition.

Although the present invention is explained by reference to a dual damascene process it will be appreciated that the method according to the present invention for treating a surface of a low-k dielectric insulating material is not limited to a damascene process or the particular method for forming a dual damascene, for example, a via first process. Rather, the present invention applies to any semiconductor feature manufacturing process where a low-k dielectric insulating layer, for example a silicon oxide doped IMD layer having a hydrophobic surface may advantageously be made more hydrophilic thereby improving an adhesion to adjacently deposited material layers in a semiconductor manufacturing process. Further, although in making exemplary reference to a damascene process by referring only to a single layer process it will be appreciated that the single layer process may be repeated in multiple layers for forming a multi-level semiconductor device. Moreover, although the exemplary embodiment is explained by reference to a particular sequence of selected layered materials formed adjacent to the low-k dielectric insulating layer it will be appreciated that the method of the present invention may be adapted to the formation of any adjacent material layer where increased hydrophilicity of the low-k dielectric insulating surface increases an adhesion thereto. For example, adjacently deposited layers of metals, metal nitrides, metal oxynitrides, oxides and carbides may advantageously exhibit an improved adhesion according to embodiments of the method of the present invention for increasing a hydrophilicity of a low-k dielectric insulating layer surface.

In a first embodiment of the present invention, a dielectric insulating layer having siloxane bonds is formed on a substrate for producing a dielectric insulating layer in a multi-level semiconductor device. Following formation of the dielectric insulating layer the dielectric insulating layer is subjected to a surface treatment to increase the hydrophilicity of the dielectric insulating layer.

In one embodiment, the dielectric insulating layer is at least one of fluorinated silicate glass (FSG), carbon doped silicon oxide, and organo-silicate glass (OSG). The dielectric layer may be formed by conventional CVD processes, for example PECVD or HDP-CVD, or by spin on processes. Preferably the dielectric insulating layer has a dielectric constant less than about 3.2. In one embodiment, the dielectric insulating layer is formed in a CVD process including organo-silane precursors. For example, the dielectric insulating layer may include commercially available proprietary process to produce, for example, BLACK DIAMOND®, and SILK® dielectric insulating layers.

In another embodiment, the organo-silane precursor includes a cyclo-tetra-siloxane group including a cyclic arrangement of four Si-O groups. In a preferred embodiment, the organo-silane precursor includes at least one of octa-methyl-cyclo-tetra-siloxane and tetra-methyl-cyclo-tetra-siloxane.

In the hydrophilicity increasing surface treatment method according to the present invention, in one embodiment, the method includes treating the surface of the dielectric insulating layer according to a dry plasma process. The plasma process for carrying out the plasma surface treatment may include any conventional plasma reactor configuration and plasma source including high density, medium density and low density plasmas. For example, for a high density plasma (HDP), the plasma source may include an electron-cyclotron-resonance (ECR) source, a helicon plasma source, an inductively coupled plasma (ICP) source, a dual plasma source (DPS), or a magnetically enhanced RIE (MERIE). Preferably, the plasma reactor is a conventional PECVD or HDP-CVD reactor.

In the dry plasma process according to the present invention, the plasma source gases include a mixture or individually supplied source gases including at least one of $NH_3$, $N_2$, $N_2O$, $O_2$, $CO_2$, and $H_2$ gases. More preferably, the plasma source gases include at least one of $NH_3$ and $H_2$. For example, the plasma source gases are provided individually or in a mixture of gases to form about 20 percent to about 100 percent by volume, with a remaining portion to make up 100 percent of the volume including an inert gas, preferably argon or helium, or mixtures thereof. In one embodiment, the plasma process conditions include an RF power of between about 150 Watts to about 500 Watts, more preferably, about 200 Watts to about 300 Watts, and a process wafer surface temperature of about 300° C. to about 400° C.

Preferably, the process wafer including the dielectric insulating layer is preheated to a temperature equal to or less than the process temperature prior to performing the plasma process. It is believed that the preheating process has the beneficial effect of degassing the process surface for improved adsorption of the plasma source gas ion onto the dielectric insulating layer surface and minimizing thermal shock due to the plasma process. For example, preferably, the plasma surface treatment forms about at least a monolayer of adsorbed plasma source ions at the dielectric insulating layer surface. Exemplary process conditions further include a plasma source gas flow rate of about 60 to about 200 sccm, more preferably about 100 to about 150 sccm with the plasma surface treatment performed for a period of about 30 seconds to about 120 seconds.

In another embodiment, multiple plasma surface treatments may be carried out to increase the hydrophilicity of the dielectric insulating layer surface. For example, in an exemplary embodiment, a hydrogen plasma treatment is first carried out according to the preferred embodiments followed by an ammonia ($NH_3$) gas treatment. For example, it is believed that carrying out the hydrogen gas treatment first serves minimize incorporation of $NH_3$ into the dielectric insulating layer surface while improving a surface hydrophilicity. For example, an excess of amines forming at the surface may adversely affect subsequent photolithographic patterning processes whereby the amines or other nitrogen containing species interfere with photogenerated acids in a DUV photoresist.

In another embodiment of the present invention, the hydrophilicity increasing surface treatment method is a wet process where the dielectric insulating layer surface is exposed to a hydrophilicity increasing solution. For example, the wet hydrophilicity increasing surface treatment includes at least dipping a semiconductor wafer in the hydrophilicity increasing solution with optionally applied ultrasonic energy, for example conventional megasonic ultrasound directed parallel to the surface. The wet hydrophilicity increasing surface treatment may alternatively include a conventional spin-spray process where the hydrophilicity increasing solution is sprayed onto the process surface while rotating the semiconductor wafer at about 200 rpm to about 1000 rpm. The hydrophilicity increasing solution preferably includes a surfactant or wetting agent including at least one of cationic surfactants, anionic surfactants and nonionic surfactants. In one embodiment, the surfactant includes an ammonium cation, for example, a quaternary ammonium substituted salt including a quaternary ammonium cation, for example, cetyltrimethylammonium chloride (CTAC), or a tertiary ammonium cation. In another embodiment, the surfactant includes one or more polar groups such as OH, COOH, $SO_3H$, and $PO_3H$. In another embodiment, the surfactant includes a diamine including an alkylated diamine. Preferable exemplary surfactants include ammonium hydroxide or tetramethylammonium hydroxide (TMAH) and ethylenediamine (EDA). Preferably, the surfactant is present in solution from about 0.1 weight % to about 10 weight percent, more preferably from about 0.5 weight percent to about 2 weight percent with the remaining portion deionized water. In a preferred embodiment, the hydrophilicity increasing solution is maintained at a temperature ranging from room temperature to its respective boiling point, for example about 120° C. The surface of the dielectric insulating layer is preferably exposed for a sufficient time to form at least about a monolayer of adsorbed species. It will be appreciated that the time period for exposure of the surface to the hydrophilicity increasing solution will depend in part on the surfactant concentration and the method of exposure. For example, in an exemplary embodiment, the hydrophilicity increasing solution includes the surfactant TMAH in a solution of deionized water at a concentration of about 1 weight percent where the hydrophilicity increasing surface treatment includes dipping the semiconductor wafer in the TMAH solution for a period of about 3 minutes to about 5 minutes.

Following exposure of the dielectric insulating layer to the hydrophilicity increasing solution, the process surface is subjected to a baking process at a temperature of about 80° C. to about 200° C. for a period of about 30 to about 60 minutes. For example, it is believed that during the baking process physisorbed ions are converted to chemisorbed ions thereby forming a stronger bond with the dielectric insulating layer surface which is also believed to be beneficial to the stability of the increased hydrophilicity of the treated surface.

For example, referring to FIG. 1 is shown a bar graph of contact angle measurements performed by conventional processes in the art where the magnitude of the contact angle of a droplet of hydrophilic liquid of known properties resting on a measured surface, for example a dielectric insulating layer, is proportional to the surface tension (energy) of the measured surface. A larger contact angle indicates a higher surface tension of the measured surface which in turn indicates a relative hydrophobicity versus a lower contact angle which indicates relative hydrophilicity. It will be appreciated that the absolute value of the contact angle will depend on a number of experimental variables including liquid measured and relative vapor pressure among other variables. A relative decrease in contact angle, however, indicates a decrease in surface tension and an increase in hydrophilicity or wettability of the surface which in turn is believed to increase the ability of the surface, for example, a dielectric insulating layer, to adhere well to adjacently deposited material layers.

In FIG. 1, Bar 1 represents the measured contact angle as shown on the vertical axis of the bar graph of an exemplary dielectric insulating layer surface, for example, carbon doped oxide, 'as deposited' with no surface treatment following deposition, for example PECVD deposition. Bar 2 shows the measured contact angle of a comparable dielectric insulating layer surface following a dipping treatment in deionized water. Bars 3 through 5 represent contact angle measurements following various hydrophilicity increasing surface treatments of comparable dielectric insulating layers according to several embodiments of the present invention. For example, Bar 3 shows the measured contact angle of the dielectric insulating layer surface following a dipping treatment with TMAH and a baking treatment according to preferred embodiments. Bars 4 and 5 represent a dry plasma process surface treatment of comparable dielectric insulating layer surfaces with $NH_3$ and $H_2$, respectively, according to preferred embodiments. The contact angle measurements demonstrate that the hydrophilicity increasing surface treatment method according to preferred embodiments of the present invention decreases the contact angles and thereby the surface energy (tension) of the treated surface to increase the wettability or hydrophilicity of the treated surface. For example, defining the measured contact angle as inversely proportional to hydrophilicity or wettablility of the treated surface, preferred embodiments of the present invention increase the hydrophilicity or wettablity by a factor of at least about 2 compared to an untreated dielectric insulating layer surface. As a result, adhesion of adjacently deposited layers to the dielectric insulating layer surface is enhanced thereby avoiding peeling or delamination of adjacently deposited layers when subjected to stresses, for example, such as those produced in CMP processes. In addition, it has been found that treatment of a dielectric insulating layer surface including anisotropically etched openings is also beneficial in increasing the adhesion of, for example, barrier/adhesion layers. The improved adhesion serves to prevent crack initiation and propagation through IMD layers, believed to be caused by separation of the barrier/adhesion layer due to thermal cycling stresses induced by thermal coefficient of expansion (TCE) mismatches occurring in metal filled anisotropically etched openings such as vias and dual damascene structures.

Referring to FIGS. 2A through 2D are shown cross sectional side view representations of stages in manufacture of a dual damascene structure according to an exemplary embodiment of the present invention. There are several techniques for manufacturing damascene structures including a dual damascene process such as via first fabrication, self-aligned fabrication, and trench first fabrication. In a typical damascene process, for example, a dual damascene manufacturing process known in the art as a via-first process, a conventional photolithographic patterning process is first used to etch a via opening through an IMD layer. Subsequently a similar process is used to define a trench opening overlying and encompassing the via opening after which the trench opening is anisotropically etched into the IMD layer to include a portion of the via opening. The via opening and trench opening are then subsequently lined with an barrier/adhesion layer of a refractory nitride, for example, tungsten nitride, tantalum nitride, titanium nitride, a dual layer of titanium and titanium nitride, or a silicided titanium layer. The opening is subsequently filled with metal, for example, copper, tungsten, or aluminum-copper alloy, by a PVD, CVD or electrodeposition process to form vias and trench lines. The surface is then planarized, preferably planarized, by dry etchback and/or chemical mechanical planarization (CMP) to remove excess metal overlying the trench level to prepare the multi-level device for further processing.

Figure 2A:
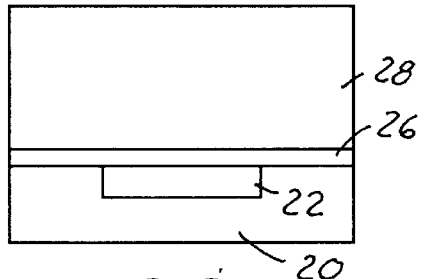
FIGS. 2A–2D are cross sectional side view representations of an exemplary implementation of the present invention at different steps in a manufacturing process to form a dual damascene structure according to an embodiment of the invention.

Referring to FIG. 2A, in an exemplary dual damascene process, for example a via-first process, a substrate 20, for example a dielectric insulating layer having a conductive area 22 is provided, for example, a copper filled trench line. Next, an etching stop layer 26 is provided over the substrate 20 formed of, for example silicon nitride (SiN), silicon oxynitride (SiON) or silicon carbide (SiC) to act as an etching stop in a subsequent operation where via openings are etched through a subsequently deposited overlying low-k dielectric insulating layer (IMD layer), to form closed communication with the conductive area 22. The etching stop layer 26 is typically deposited by chemical vapor deposition using for example, PECVD, or low pressure CVD (LPCVD) to a thickness of about 300 Angstroms to about 1000 Angstroms.

Still referring to FIG. 2A, following deposition of the etching stop layer 26 a low-k dielectric insulating layer (IMD layer) 28, is formed according to previously outline preferred embodiments, for example carbon doped oxide formed from organosilane precursors in a PECVD process deposited to a thickness of about 3000 to about 10,000 Angstroms. Following deposition of the IMD layer 28, the IMD layer is subjected to a hydrophilicity increasing surface treatment according to previously outlined preferred embodiments, for example, at least one of a dry plasma treatment and a hydrophilicity increasing solution treatment followed by a baking treatment according to the preferred embodiments. In a less preferred embodiment, due to increased capacitance contributions it will be appreciated that two dielectric insulating layers (IMD layers) may be formed for creating the dual damascene structure with a hydrophilicity increasing surface treatment following the formation of each IMD layer, for example, one IMD layer for forming the vias therein and one IMD layer for forming the trench lines therein. It will be appreciated that if two IMD layers are used that an etching stop or capping layer may be provided between the IMD layers, for example, formed in the same manner as etching stop layer 26.

Figure 2B:
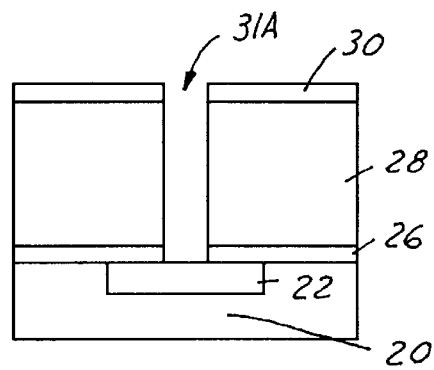

Referring to FIG. 2B, following the hydrophilicity increasing surface treatment of the IMD layer, an etching stop layer 30, for example silicon oxynitride or silicon carbide is formed in the same manner as etching stop layer 26 is deposited over the IMD layer. A bottom anti-reflectance coating (BARC) (not shown), for example silicon oxynitride, is preferably deposited over the etching stop layer 30 to reduce undesired light reflection in subsequent photolithographic patterning processes for producing the via and trench opening. If the etching stop layer is silicon oxynitride, the necessity of an additional BARC layer is unnecessary as the silicon oxynitride layer serves both etching stop and ARC functions.

Still referring to FIG. 2B, the etching stop layer 30 is photolithographically patterned for anisotropically etching a via opening, for example, by applying a deep ultraviolet (DUV) photoresist overlayer (not shown) active to wavelengths of about 248 nm or less. Following photolithographic patterning, a conventional anisotropic plasma etching process including, for example, hydrofluorocarbons and fluorocarbons having a carbon to fluorine ratio of about 2 to about 4 is used to first etch through the etching stop layer 30; through the IMD layer 28; and through etching stop layer 26 to form a via opening 31A in closed communication with conductive area 22.

Figure 2C:
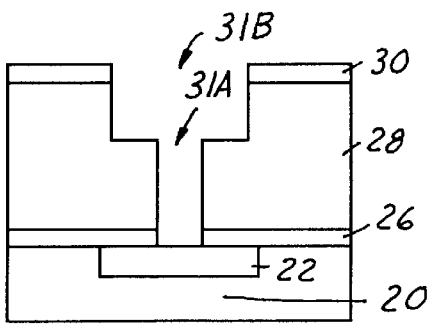

Referring to FIG. 2C, a similar second photolithographic process is then carried out to pattern trench openings overlying and encompassing the via opening 31A. Prior to the trench line patterning process, a polymeric resin may optionally be deposited and etched back to form a via plug (not shown) filling a portion of the via hole to protect the via opening 31A and to prevent out-diffusion of absorbed nitrogen species from the IMD layer capable of interfering with the trench line patterning process. Still referring to FIG. 2C a trench opening 31B is anisotropically etched overlying and encompassing the via opening 31A to form a dual damascene structure.

Following formation and cleaning of the dual damascene structure to remove residual organic material, the dual damascene structure is again subjected to a hydrophilicity increasing surface treatment according to preferred embodiments. Preferably, if the surface treatment is a dry plasma process, the plasma processing conditions including an RF power and an AC bias power applied to the process wafer are adjusted to produce a negative self bias of about −100 Volts to about −200 Volts to improve plasma bombardment within the anisotropically etched opening.

Figure 2D:
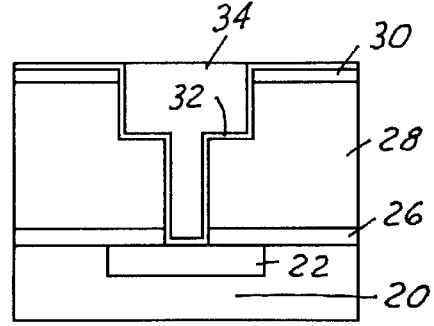

Referring to FIG. 2D, following the hydrophilicity increasing surface treatment, a barrier/adhesion layer 32 of, for example tantalum nitride, is deposited to line the dual damascene structure opening, for example using an LPCVD process and blanket depositing the barrier/adhesion layer 32 to a thickness of about 10 nm to about 100 nm. A metal filling, for example copper filling 34 is then deposited according to a conventional electrodeposition process including first depositing a copper seed layer (not shown) by a PVD process. The process surface is then chemically mechanically polished (CMP) to planarize the process surface to complete the formation of a dual damascene.

Figure 3:
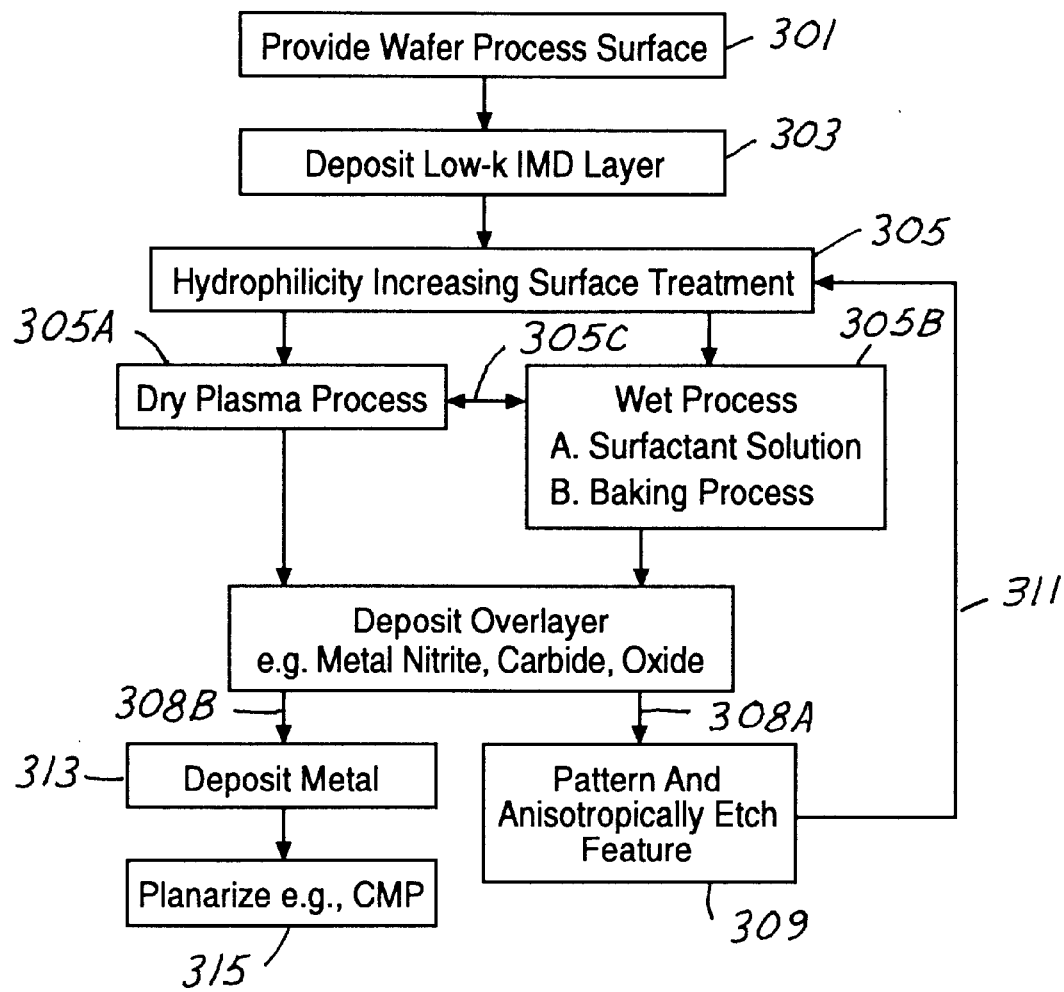
FIG. 3 is a process flow diagram including several embodiments of the present invention.

Referring to FIG. 3 is shown a process flow diagram including several embodiments of the present invention. In process 301, a semiconductor wafer process surface is provided for forming a dielectric insulating layer thereover. In process 303, a low-k dielectric insulating layer (e.g., IMD layer) according to preferred embodiments is deposited. In process 305, a hydrophilicity increasing surface treatment of the dielectric insulating layer according to preferred embodiments is carried out to increase the dielectric insulating layer. For example, at least one of process 305A, a dry plasma treatment according to preferred embodiments, and process 305B a wet process including a surfactant containing solution contacting the dielectric insulating layer surface followed by a baking process according to preferred embodiments is carried out. For example, as indicated by bi-directional process arrow 305C, a dry plasma process followed by a wet process or vice-versa may optionally be carried out. It will be appreciated that the dry plasma process may include multiple plasma treatments with different source gases or mixtures as previously outlined. Following the hydrophilicity or increasing surface treatment, in process 307 an overlayer of material, for example a metal nitride (e.g., SiON) BARC layer is deposited. In process 309 following directional process arrow 308A a semiconductor feature is patterned and anisotropically etched, for example, a dual damascene. As indicated by directional process arrow 311, the hydrophilicity increasing surface treatment is repeated to increase the hydrophilicity or wettability of the exposed dielectric insulating layer in the anisotropically etched feature. Repeating process 309, a material overlayer, for example, an metal nitride barrier/adhesion layer is deposited over the anisotropically etched feature. Following directional process arrow 308B, in process 313, a metal deposition process followed by planarization process 315 is carried out to complete a feature formation.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a dielectric insulating layer with increased hydrophilicity for improving adhesion of an adjacently deposited material layer in semiconductor device manufacturing comprising the steps of:

providing a semiconductor wafer having a process surface for forming a dielectric insulting layer thereover;

depositing the dielectric insulating layer; and, subjecting the dielectric insulating layer including an exposed surface to a hydrophilicity increasing treatment including at least one of a dry plasma treatment and a wet process including contacting the exposed surface with a hydrophilicity increasing solution including a surfactant said wet process followed by a baking process to improve an adhesion of an adjacently deposited material layer.

2. The method of claim 1, wherein the dielectric insulating layer is doped with one of carbon and fluorine to reduce a dielectric constant.

3. The method of claim 1, wherein the dielectric insulating layer has a dielectric constant of less than about 3.2.

4. The method of claim 1, wherein the dry plasma surface treatment includes forming a plasma including supplying one of a mixture and individually supplied source gas including at least one of $NH_3$, $N_2$, $N_2O$, $O_2$, $CO_2$, and $H_2$.

5. The method of claim 4, wherein the dry plasma surface treatment includes multiple dry plasma surface treatments.

6. The method of claim 4, wherein the dry plasma surface treatment includes a pre-heating step wherein the semiconductor wafer is heated to about 300 to about 400 degrees Centigrade to include degassing the exposed surface.

7. The method of claim 4, wherein the dry plasma process conditions include an RF power of about 100 Watts to about 500 Watts, an optionally applied AC bias power of about 100 Watts to about 300 Watts, and a flow rate of the source gas at about 60 sccm to about 200 sccm, and a pressure of about 1 milliTorr to about 100 milliTorr.

8. The method of claim 7, wherein the RF power and the AC bias power are adjusted to produce a negative DC self-bias of about −100 Volts to about −200 Volts at the semiconductor wafer.

9. The method of claim 4, wherein the dry plasma process is carried out for a sufficient period of time to form at least a monolayer of adsorbed source gas ions.

10. The method of claim 7, wherein the dry plasma process is carried out for a period of about 30 seconds to about 120 seconds.

11. The method of claim 1, wherein the wet process includes at least one of dipping, ultrasonic scrubbing, and a spin-spray process.

12. The method of claim 1, wherein the surfactant includes at lest one of an anionic surfactant, a cationic surfactant, and a nonionic surfactant.

13. The method of claim 1, wherein the surfactant includes at least one of an amine, a diamine, an alkylated diamine, an hydroxide, and a carboxylic acid.

14. The method of claim 13, wherein the surfactant includes at least one of tetramethylammonium hydroxide (TMAH) and ethylene diamine (EDA).

15. The method of claim 12, wherein the surfactant is present in a concentration of about 0.1 weight percent to about 10 weight percent.

16. The method of claim 13, wherein the surfactant is present in a concentration of about 0.5 weight percent to about 2.0 weight percent.

17. The method of claim 11, wherein the temperature of the hydrophilicity increasing solution is from about room temperature to about a boiling point of the hydrophilicity increasing solution.

18. The method of claim 1, wherein the baking process is carried out at a temperature of about 80 degrees Centigrade to about 200 degrees Centigrade for a period of about 30 minutes to about 60 minutes to convert at least a portion of adsorbed ions at the exposed surface from a physisorbed to a chemisorbed state.

19. The method of 1 wherein the dielectric insulating layer includes an anisotropically etched opening.

20. The method of claim 1, wherein the adjacently deposited material layer includes at least one of a metal, a metal nitride, a metal oxynitride, a carbide, and an oxide.

* * * * *